(12) United States Patent
Jung et al.

(10) Patent No.: US 10,620,254 B2
(45) Date of Patent: Apr. 14, 2020

(54) APPARATUS AND METHOD FOR ANALYZING INFLUENCE OF ELECTROMAGNETIC WAVES

(71) Applicant: AGENCY FOR DEFENSE DEVELOPMENT, Daejeon (KR)

(72) Inventors: Myoung-Won Jung, Daejeon (KR); Woo Sang Lee, Daejeon (KR); Jin Soo Choi, Daejeon (KR); Sung Hyun Baek, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 365 days.

(21) Appl. No.: 15/849,539

(22) Filed: Dec. 20, 2017

(65) Prior Publication Data

US 2019/0120888 A1 Apr. 25, 2019

(30) Foreign Application Priority Data

Oct. 20, 2017 (KR) .......................... 10-2017-0136935

(51) Int. Cl.
| | |
|---|---|
| *G01R 31/00* | (2006.01) |
| *G01S 13/06* | (2006.01) |
| *G01S 13/86* | (2006.01) |
| *G01S 13/58* | (2006.01) |
| *B64C 39/02* | (2006.01) |
| *G01R 29/08* | (2006.01) |
| *G01S 13/42* | (2006.01) |

(52) U.S. Cl.
CPC .......... *G01R 31/001* (2013.01); *B64C 39/024* (2013.01); *G01R 29/0814* (2013.01); *G01S 13/06* (2013.01); *G01S 13/58* (2013.01); *G01S 13/867* (2013.01); *G01S 13/42* (2013.01)

(58) Field of Classification Search
CPC ... G01R 31/001; G01R 29/0814; G01S 13/58; G01S 13/867; G01S 13/06; G01S 13/42; B64C 39/024
See application file for complete search history.

(56) References Cited

U.S. PATENT DOCUMENTS

| | | | |
|---|---|---|---|
| 2012/0032832 A1 | 2/2012 | Tauber et al. | |
| 2014/0070977 A1* | 3/2014 | Stocke, Jr. | H01Q 17/00 342/1 |
| 2016/0086391 A1* | 3/2016 | Ricci | G07C 5/008 701/29.3 |
| 2017/0261539 A1* | 9/2017 | Revel | G01R 31/001 |
| 2017/0288475 A1* | 10/2017 | Lee | H02J 50/60 |
| 2018/0167131 A1* | 6/2018 | Liu | H04B 3/50 |

FOREIGN PATENT DOCUMENTS

KR 10-2016-0116531 A 10/2016

* cited by examiner

*Primary Examiner* — Russell Frejd
(74) *Attorney, Agent, or Firm* — Fenwick & West LLP

(57) ABSTRACT

An apparatus for analyzing influence of electromagnetic waves comprises an electromagnetic wave radiation unit configured to radiate electromagnetic waves, a drone control unit configured to transmit to a target drone control information for controlling the target drone, an information receiving unit configured to receive status information indicating an operation state of the target drone as a response to the control information and an electromagnetic wave influence analyzing unit configured to determine the influence of the electromagnetic waves on the target drone by comparing the control information and the status information.

20 Claims, 4 Drawing Sheets

APPARATUS AND METHOD FOR ANALYZING INFLUENCE OF ELECTROMAGNETIC WAVES

CROSS-REFERENCE TO RELATED APPLICATIONS

This application claims priority to and benefit of Korean Patent Application No. 10-2017-0136935, filed on Oct. 20, 2017, the disclosure of which is incorporated herein in its entirety by reference.

TECHNICAL FIELD

The present disclosure relates to an apparatus and method for analyzing the influence of electromagnetic waves and, more particularly, to the apparatus and method for analyzing the influence of electromagnetic waves on a drone.

BACKGROUND

A drone widely used in various industrial fields in recent years includes a large number of parts such as a GPS sensor, an acceleration sensor, a compass sensor, a motor for driving a propeller, an electronic speed controller (ESC) for controlling the revolution per minute (RPM) of the motor, a flight controller (FC) for determining a current signal generated by the ESC, a communication module for transmitting and receiving various kinds of information to and from an external device, and the like.

If the parts of the drone are exposed to a high electromagnetic wave environment, an abnormality may occur. In particular, since the drone operates through the cooperation of multiple parts, even if an abnormality occurs in just one part, the overall operation of the drone may be seriously hindered, i.e., the drone may be placed in an uncontrollable state or crash.

For these reasons, when attacking an enemy drone, using electromagnetic waves to, various attack methods have been used such as crash the drone, turn the drone back to the direction from which it came, or the like.

As a result, it is necessary to collect information on what abnormal behaviors appear on drone depending on a variety of conditions such as different types and intensities of electromagnetic waves. Further, it is necessary to collect information on what part of the drone is causing the abnormal behavior based on the specific condition.

SUMMARY

Embodiments of the present disclosure provide a technique for analyzing the influence of various types of electromagnetic waves on a drone and the cause of abnormal behavior generated due to electromagnetic waves.

However, the technical objective of the embodiments of the present disclosure is not limited to the above-mentioned objective. Additional technical objectives may be derived within the extent obvious to an ordinary skilled person from the contents described below.

An apparatus for analyzing influence of electromagnetic waves may comprise an electromagnetic wave radiation unit configured to radiate electromagnetic waves, a drone control unit configured to transmit to a target drone control information for controlling the target drone, an information receiving unit configured to receive status information indicating an operation state of the target drone as a response to the control information and an electromagnetic wave influence analyzing unit configured to determine the influence of the electromagnetic waves on the target drone by comparing the control information and the status information.

The apparatus may further comprise a drone tracing unit configured to acquire position information of the target drone, wherein the electromagnetic wave radiation unit is configured to radiate the electromagnetic waves toward the target drone based on the position information.

Further, the position information may include at least one of coordinates of a location of the target drone with respect to a position of the apparatus, a distance from the apparatus to the target drone, a moving direction of the target drone and an altitude of the target drone.

Further, the drone tracing unit may be configured to acquire the position information via a radar for detecting the target drone or an imaging device for capturing an image of the target drone.

Further, the electromagnetic wave radiation unit may be configured to change at least one of kind, intensity, frequency, pulse width and pulse repetition period of the electromagnetic waves.

Further, the information receiving unit may be configured to receive the status information from at least one of a sensor provided in the target drone, a radar for tracing the target drone and an imaging device for capturing an image of the target drone.

Further, when the information receiving unit receives the status information from the sensor, the status information may include at least one of a control signal transmitted from a flight controller of the target drone to an electronic speed controller (ESC) of the target drone, a current signal transmitted from the ESC to a motor of the target drone and RPM information of the motor.

Further, when the information receiving unit receives the status information from the radar or the imaging device, the status information may include at least one of a position of the target drone, a moving direction of the target drone, a posture of the target drone and a speed of the target drone.

Further, the status information may be acquired from at least one of a motor sensor, a GPS sensor, a gyro sensor, an acceleration sensor and a compass sensor provided in the target drone.

Further, when the control information and the status information do not coincide with each other, the electromagnetic wave influence analyzing unit may be configured to determine a cause of the inconsistency between the status information and the control information based on a difference between the control information and the status information.

Further, the electromagnetic wave influence analyzing unit may be configured to pre-store abnormality information indicating an abnormal operation status of each component in the target drone and to determine whether the status information coincides with the abnormality information.

Further, the electromagnetic wave influence analyzing unit may be configured to pre-store information on the target drone including at least one of model, size, type, manufacturer, flight controller information, electronic speed controller information and motor information, and to determine a degree of change of the status information according to the information on the target drone.

An method for analyzing an influence of electromagnetic waves may comprise a step of radiating electromagnetic waves toward a target drone, a step of transmitting to the target drone control information for controlling the target drone, a step of receiving status information indicating an operation state of the target drone as a response to the control information and a step of determining the influence of the electromagnetic waves on the target drone by comparing the control information and the status information.

The method may further comprise a step of acquiring position information of the target drone, wherein the step of radiating the electromagnetic waves includes radiating the electromagnetic waves toward the target drone based on the position information.

Further, the step of acquiring the position information may include acquiring the position information via a radar for detecting the target drone or an imaging device for capturing an image of the target drone.

Further, the step of receiving the status information may include receiving the status information from at least one of a sensor provided in the target drone, a radar for tracing the target drone and an imaging device for capturing an image of the target drone.

Further, when the status information is received from the sensor, the status information may include at least one of a control signal transmitted from a flight controller of the target drone to an electronic speed controller of the target drone, a current signal transmitted from the ESC to a motor of the target drone and RPM information of the motor.

Further, when the control information and the status information do not coincide with each other, the step of determining the influence of the electromagnetic waves may include, determining a cause of the inconsistency between the status information and the control information based on a difference between the control information and the status information.

Further, the step of determining the influence of the electromagnetic waves may include pre-storing abnormality information indicating an abnormal operation status of each component in the target drone and determining whether the status information coincides with the abnormality information.

Further, the step of determining the influence of the electromagnetic waves may include pre-storing information on the target drone including at least one of model, size, type, manufacturer, flight controller information, electronic speed controller information and motor information, and determining a degree of change of the status information according to the information on the target drone.

According to the embodiments of the present disclosure, it is possible to find methods for effectively protecting a drone against an electromagnetic wave attack or the like by analyzing the abnormal state of the drone generated by electromagnetic waves under various conditions and the cause thereof.

Further, according to the embodiments of the present disclosure, it is possible to effectively cope with an electromagnetic wave attack by analyzing in advance the resistance of a drone to electromagnetic waves depending on the size, type, manufacturer, chip structure, etc. of the drone.

DETAILED DESCRIPTION

Figure 1:
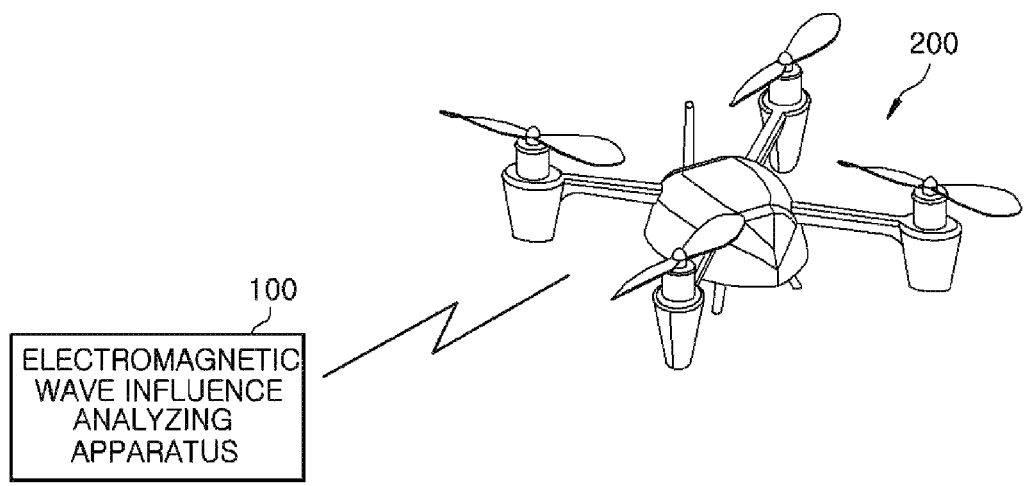
FIG. 1 shows an overall system including an apparatus for analyzing the influence of electromagnetic waves according to an embodiment of the present disclosure and a drone.

The advantages and features of the present disclosure and methods of accomplishing such will be clearly understood from the following description taken in conjunction with the accompanying drawings. However, the present disclosure is not limited to those embodiments described, as embodiments may be implemented in various forms. It should be noted that the present embodiments are provided to make a full disclosure and also to allow those skilled in the art to know the full range of the present disclosure. Therefore, the scope of the present invention should be defined only by the appended claims.

In describing the embodiments of the present disclosure, if it is determined that the detailed description of related known components or functions unnecessarily obscures the gist of the present disclosure, the detailed description thereof will be omitted. Further, the terminologies to be described below are defined in consideration of functions of the embodiments of the present disclosure and may vary depending on a user's or an operator's intention or practice. Accordingly, the definition made should be based in consideration of the contents of the entire specification.

Functional blocks illustrated in the drawings and described below are merely examples of possible implementations. In other implementations, different functional blocks may be used without departing from the scope of the detailed description. Although one or more functional blocks of the present disclosure are illustrated as separate blocks, one or more of the functional blocks of the present disclosure may be a combination of various hardware and software elements executing the same function.

Further, it should be understood that an expression that some elements are "included" is an expression of an "open type" and the expression simply denotes that the corresponding elements are present, but does not exclude additional elements.

Furthermore, when one element is described as being "connected" or "coupled" to the other element, it should be understood that one element may be directly connected or coupled to the other element, but a third element may be interposed between the two elements.

Hereinafter, embodiments of the present disclosure will be described with reference to the accompanying drawings.

FIG. 1 shows an overall system 10 including an apparatus for analyzing the influence of electromagnetic waves 100 according to an embodiment of the present disclosure and a drone 200.

The apparatus for analyzing the influence of electromagnetic waves 100 is an apparatus that analyzes the influence of electromagnetic waves on a drone 200 by determining whether a target drone 200 that is being controlled to move based on the control information of the drone 200 is still moving according to control information of the drone 200 when the electromagnetic waves are radiated toward the drone 200.

The drone 200 is an unmanned aerial vehicle that can be piloted wirelessly via control signals. The drone 200 may include a large number of parts such as a GPS sensor, an acceleration sensor, a compass sensor, a motor for driving a propeller, an electronic speed controller (ESC) for controlling the revolution per minute (RPM) of the motor, a flight controller (FC) for determining a current signal generated by the ESC, a communication module for transmitting and receiving various kinds of information to and from an external device, and the like.

If the parts of the drone 200 are exposed to a high electromagnetic wave environment, an abnormality may occur. In particular, since the drone 200 operates through the cooperation of multiple parts, even if an abnormality occurs in just one part, the overall operation of the drone 200 may be seriously hindered, i.e., the drone 200 may be placed in an uncontrollable state or crash.

According to an embodiment of the present disclosure, the apparatus for analyzing the influence of electromagnetic waves 100 makes it possible to analyze the influence (fault or abnormal behavior) of various kinds of electromagnetic waves on the drone 200 and the cause thereof. The configuration of the apparatus for analyzing the influence of electromagnetic waves 100 according to an embodiment of the present disclosure will now be described in detail with reference to FIG. 2.

Figure 2:
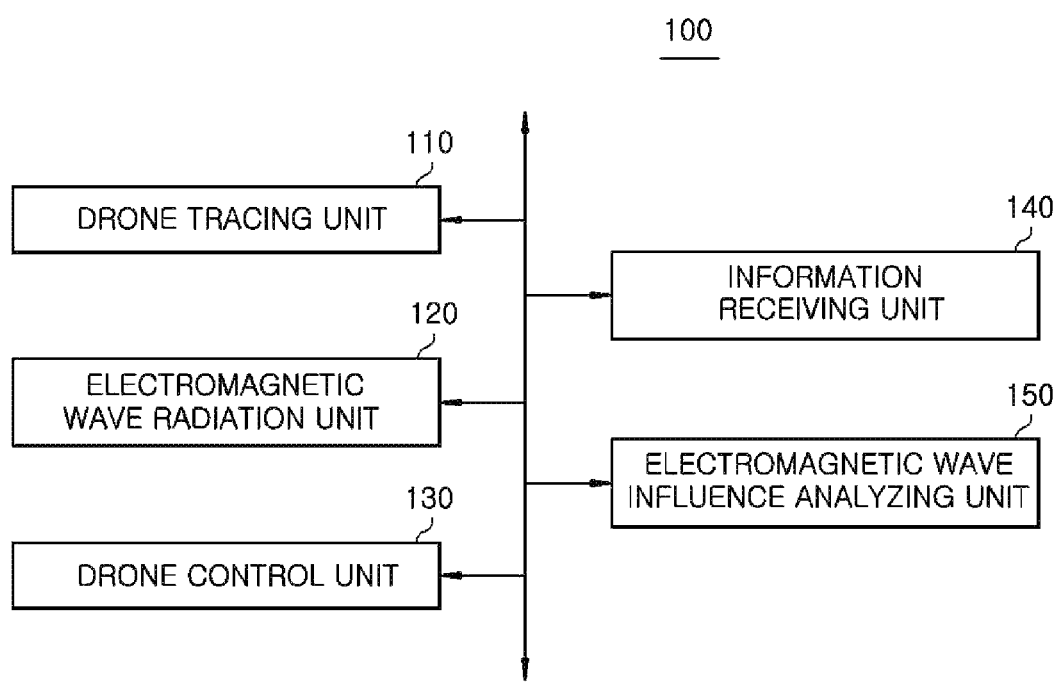
FIG. 2 is a functional block diagram of an apparatus for analyzing the influence of electromagnetic waves according to an embodiment of the present disclosure.

FIG. 2 is a functional block diagram of the apparatus for analyzing the influence of electromagnetic waves 100 according to an embodiment of the present disclosure.

Referring to FIG. 2, the apparatus for analyzing the influence of electromagnetic waves 100 according to an embodiment of the present disclosure includes an electromagnetic wave radiation unit 120, a drone control unit 130, an information receiving unit 140 and an electromagnetic wave influence analyzing unit 150. In addition, the apparatus for analyzing the influence of electromagnetic waves 100 may further include a drone tracing unit 110.

The drone tracing unit 110 acquires position information of a target drone 200. To this end, the drone tracing unit 110 may acquire the position information of the drone 200 through the use of radar that traces the drone 200 by transmitting a pulse signal to the drone 200 and receiving an echo signal reflected from the drone 200 or an imaging device that captures an image of the drone 200. In this regard, the drone tracing unit 110 may include the radar or the imaging device. The position information of the drone 200 may include two-dimensional or three-dimensional coordinates of the location of the drone 200 with respect to the position of the apparatus for analyzing the influence of electromagnetic waves 100, the distance from the apparatus for analyzing the influence of electromagnetic waves 100 to the drone 200, the moving direction of the drone 200 and the altitude of the drone 200.

The electromagnetic wave radiation unit 120 radiates electromagnetic waves to the outside. The electromagnetic waves radiated by the electromagnetic wave radiation unit 120 can hinder the drone 200 from moving according to the control information. Further, the electromagnetic wave radiation unit 120 can radiate electromagnetic waves toward the drone 200 based on the position information of the drone 200 acquired by the drone tracing unit 110. For example, the electromagnetic wave radiation unit 120 may radiate electromagnetic waves by estimating the current position of the drone 200 and anticipating the future moving direction of the drone 200 in view of the coordinates, distance, altitude and moving direction of the drone 200 with respect to the position of the apparatus for analyzing the influence of electromagnetic waves 100.

Moreover, the electromagnetic wave radiation unit 120 may change the kind, intensity, frequency, pulse width and pulse repetition period of the electromagnetic waves to be radiated. Thus, the electromagnetic wave radiation unit 120 may simulate various electromagnetic wave environments and attack situations to which the drone 200 may be actually exposed. The electromagnetic wave radiation unit 120 enables the electromagnetic wave influence analyzing unit 150 to analyze the influence of the characteristics of various electromagnetic waves on the drone 200.

The drone control unit 130 transmits control information for controlling the drone 200 to the drone 200. The control information can be used for controlling the position, moving direction, posture, speed and the like of the drone 200. The control information may be generated according to the information of a controller manually operated by a user. Alternatively, the control information may be preset information on a predetermined motion of the drone 200. An example in which the drone 200 is operated according to the control information will be described with reference to FIG. 3. The control information transmitted by the drone control unit 130 is different from the electromagnetic waves radiated by the electromagnetic wave radiation unit 120.

Figure 3:
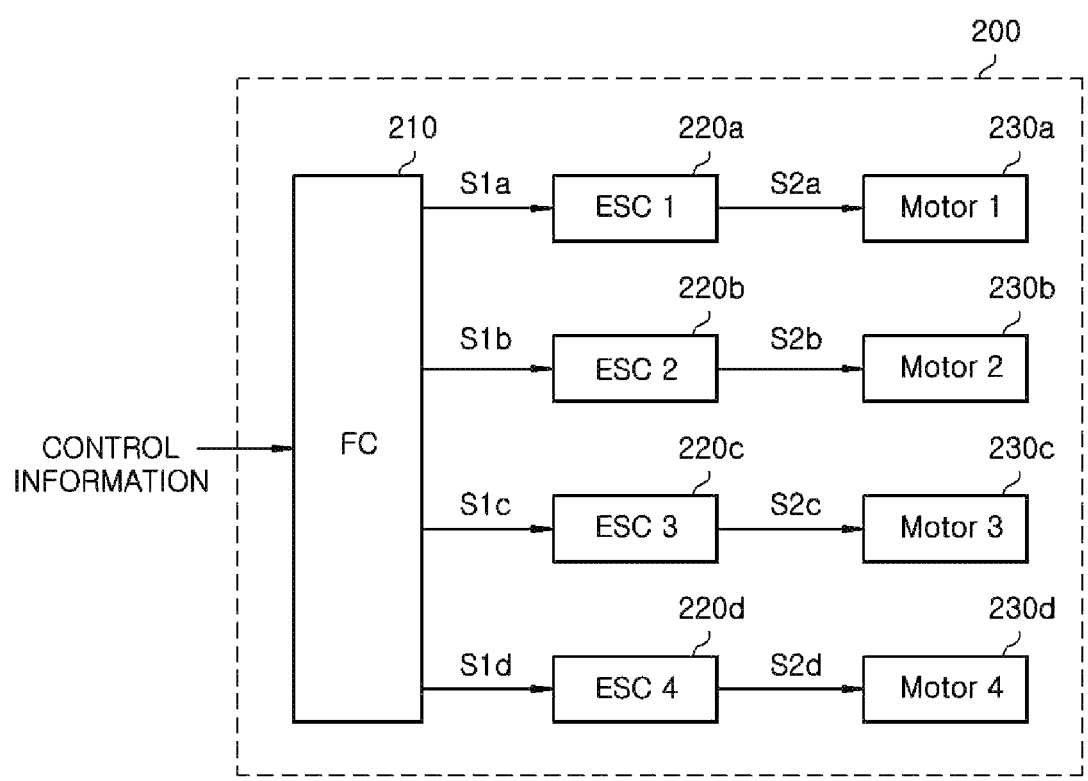
FIG. 3 is an illustrative view for explaining a process of controlling a drone based on control information according to an embodiment of the present disclosure.

FIG. 3 is an illustrative view for explaining a process of controlling the target drone 200 based on the control information according to an embodiment of the present disclosure.

The drone 200 illustrated in FIG. 3 includes four propeller driving units. The drone 200 may include a flight controller (FC) 210, four electronic speed controller (ESC) 220*a*, 220*b*, 220*c* and 220*d*, and four motors 230*a*, 230*b*, 230*c* and 230*d*. However, the drone 200 illustrated in FIG. 3 is nothing more than one example. The components included in the drone 200 and the components of the drone 200 controlled by the control information may vary depending on the type of the drone 200 and the control method thereof.

Referring to FIG. 3, the control information may include information on the moving direction and speed of the drone 200. Thus, the FC 210 may calculate the RPM of each of the respective motors required to make the drone 200 fly in a specific direction and at a specific speed. As a result, the FC 210 calculates the intensities of current signals S2*a*, S2*b*, S2*c* and S2*d* to be supplied to the respective motors 230*a*, 230*b*, 230*c* and 230*d* and applies control signals S1*a*, S1*b*, S1*c* and S1*d* to the ESCs 220*a*, 220*b*, 220*c* and 220*d* so that the ESCs 220*a*, 220*b*, 220*c* and 220*d* can generate current signals S2*a*, S2*b*, S2*c* and S2*d* having specific intensities. Thus, the respective ESCs 220*a*, 220*b*, 220*c* and 220*d* apply current signals S2*a*, S2*b*, S2*c* and S2*d* having specific intensities to the motors 230*a*, 230*b*, 230*c* and 230*d* respectively connected to the ESCs 220*a*, 220*b*, 220*c* and 220*d*. Each of the motors 230*a*, 230*b*, 230*c* and 230*d* is rotated at the RPM corresponding to the intensity of each of the current signals S2*a*, S2*b*, S2*c* and S2*d*, thereby enabling the drone 200 to move in the direction and at the speed indicated by the control signals. In this case, the information on the FC 210, the ESCs 220*a*, 220*b*, 220*c* and 220*d*, the motors 230*a*, 230*b*, 230*c* and 230*d*, the control signals S1*a*, S1*b*, S1*c* and S1*d* and the current signals S2*a*, S2*b*, S2*c* and S2*d* may be status information, to be described later, which may be compared with the control information to determine if any component of the drone 200 is having an abnormality due to the electromagnetic waves.

The information receiving unit 140 receives the status information indicating the actual operation status of the target drone 200 as a response to the transmitted control information. At this time, the information receiving unit 140 may receive the status information from a sensor provided in the drone 200. Alternatively, the information receiving unit 140 may receive the status information from the radar for tracing the drone 200 or the imaging device for capturing an image of the drone 200.

In the case where the information receiving unit 140 receives the status information from the sensor provided in the drone 200, the status information may include information on the control signals S1*a*, S1*b*, S1*c* and S1*d* transmitted from the FC 210 to the ESCs 220*a*, 220*b*, 220*c* and 220*d*, the current signals S2*a*, S2*b*, S2*c* and S2*d* transmitted from the ESCs 220*a*, 220*b*, 220*c* and 220*d* to the motors 230*a*, 230*b*, 230*c* and 230*d* provided in the drone 200, and the RPM of each of the motors 230*a*, 230*b*, 230*c* and 230*d*. In order to provide the status information, the drone 200 may be equipped with a motor sensor, a GPS sensor, a gyro sensor, an acceleration sensor, a compass sensor and the like. The status information may be acquired from such sensors and may be transmitted to the apparatus for analyzing the influence of electromagnetic waves 100.

In the case where the information receiving unit 140 receives the status information from the radar for tracing the drone 200 or the imaging device for capturing an image of the drone 200, the status information may include information on the position of the drone 200, the moving direction of the drone 200, the posture of the drone 200 and the speed of the drone 200.

The electromagnetic wave influence analyzing unit 150 determines the influence of the electromagnetic waves radiated by the electromagnetic wave radiation unit 120 on the drone 200 by comparing the control information transmitted from the drone control unit 130 with the status information indicating the state in which the drone 200 is moved in response to the control information.

For example, when the control information and the status information do not coincide with each other, namely when the target drone 200 does not move in response to the control information, the electromagnetic wave influence analyzing unit 150 may determine the component of the drone 200 causing the inconsistency between the control information and the status information, based on the difference between the control information and the status information. As an example, when the control information includes information that causes the drone 200 to sequentially move upward, downward, leftward and rightward, if the status information received from the drone 200 indicates that the upward, downward and leftward movements are performed but the rightward movement is not performed, the electromagnetic wave influence analyzing unit 150 may determine that the electromagnetic waves radiated from the electromagnetic wave influence analyzing unit 150 affect the component of the drone 200 that performs the rightward movement.

Furthermore, the electromagnetic wave influence analyzing unit 150 may pre-store abnormality information indicating an abnormal operation status of the drone 200 for each component when the corresponding component has an abnormality and may determine whether the status information coincides with the abnormality information. As an example, the electromagnetic wave influence analyzing unit 150 may pre-store abnormality information that indicates the occurrence of an abnormality when the motor is accelerated by 1000 rpm or more, and may determine that the radiated electromagnetic waves affect the motor of the drone 200 if the status information received from the drone 200 indicates that the motor is accelerated by 1000 rpm or more.

In addition, the electromagnetic wave influence analyzing unit 150 may analyze the influence of electromagnetic waves on various kinds of drones by pre-storing information of the drone 200, including at least one of model, size, type, manufacturer, FC information, ESC information, and motor information, and determining the degree of change of the status information when the drones 200 are exposed to electromagnetic waves with the same characteristics. By analyzing the correlation of the drone 200 with model, size, type, manufacturer, FC information, ESC information and motor information based on the analysis result, the electromagnetic wave influence analyzing unit 150 may pre-store the information on how the electromagnetic waves affect the drone 200 depending on the specific characteristics of the drone 200. Thus, according to an embodiment of the present disclosure, it is possible to effectively predict the influence of electromagnetic waves on a drone that has not been subjected to electromagnetic wave tests, based on the results of tests stored according to the information on the drone 200.

Meanwhile, the drone 200 may have a function to enter a safety mode when a fault or an abnormality is generated in the component thereof. For example, when an abnormality is generated in the GPS sensor, the drone 200 may enter a safety mode to maintain hovering or to land at the current position, thereby preventing large damage. In such a case, the electromagnetic wave influence analyzing unit 150 may pre-store status information available at the time of entering safety mode. If the status information of the drone 200 indicates that the drone 200 has entered safety mode, the electromagnetic wave influence analyzing unit 150 may determine an abnormal component of the drone 200 by finding the cause of entering safety mode.

In addition, the electromagnetic wave influence analyzing unit 150 may analyze the influence of various kinds of electromagnetic waves on the drone 200 by controlling the electromagnetic wave radiation unit 120 to change the type (continuous waves, pulse waves, etc.), intensity, frequency, pulse width, pulse repetition period or the like of electromagnetic waves. To this end, the electromagnetic wave influence analyzing unit 150 may pre-store an analysis scenario planned in advance, control the electromagnetic wave radiation unit 120 to change the radiation conditions of electromagnetic waves sequentially radiated according to the analysis scenario, and determine the influence of the respective electromagnetic waves on the drone 200.

The drone tracing unit 110, the electromagnetic wave radiation unit 120, the drone control unit 130, the information receiving unit 140 and the electromagnetic wave influence analyzing unit 150 included in the apparatus for analyzing the influence of electromagnetic waves 100 may be realized by a memory including commands programmed to perform the functions thereof, and an operation device including a microprocessor for performing the commands.

Figure 4:
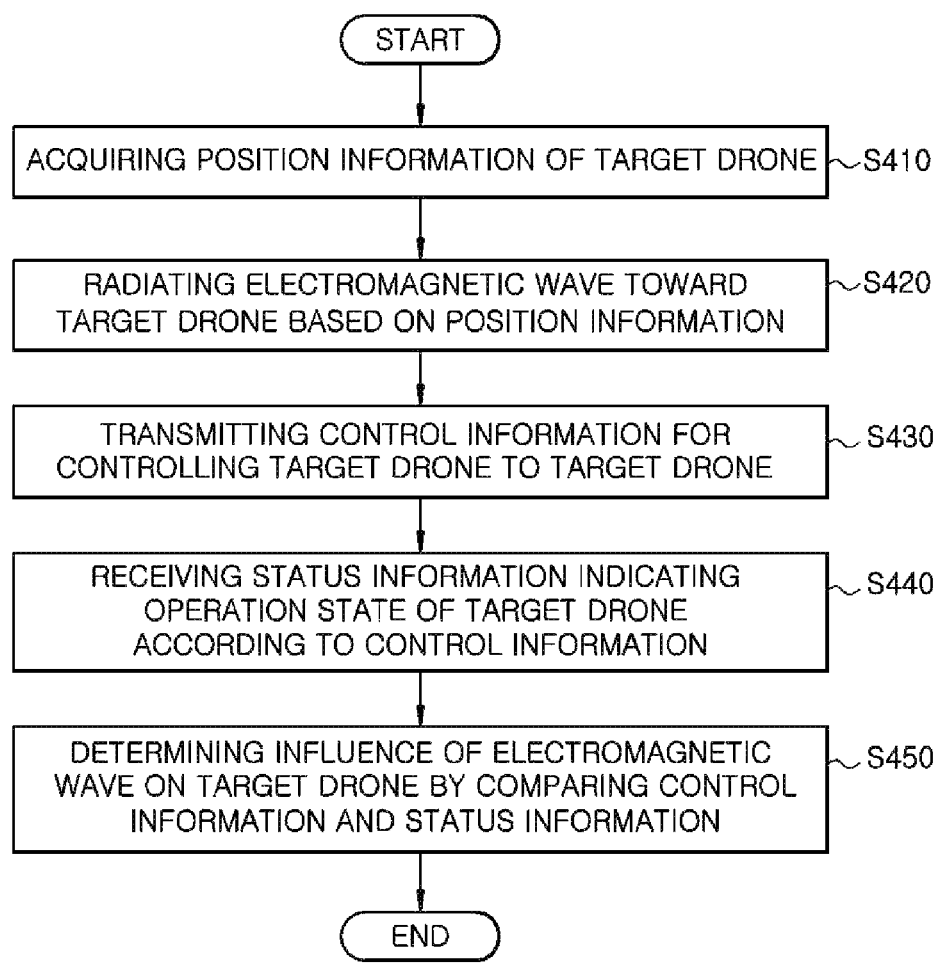
FIG. 4 is a flowchart showing a process of an electromagnetic wave influence analyzing method according to an embodiment of the present disclosure.

FIG. 4 is a flowchart showing a process of an electromagnetic wave influence analyzing method according to an embodiment of the present disclosure. The respective steps of the electromagnetic wave influence analyzing method shown in FIG. 4 may be performed by the apparatus for analyzing the influence of electromagnetic waves 100 described above with reference to FIGS. 1 to 3. The respective steps will now be described.

First, the drone tracing unit 110 acquires position information of the target drone 200 (S410). Then, the electromagnetic wave radiation unit 120 radiates electromagnetic waves toward the target drone 200 based on the position information (S420). At this time, the drone control unit 130 transmits control information for controlling the drone 200 to the drone 200 (S430). The information receiving unit 140 receives status information indicating the operation state of the drone 200 as a response to the control information (S440). Thereafter, the electromagnetic wave influence analyzing unit 150 determines the influence of electromagnetic waves on the drone 200 by comparing the control information and the status information (S450).

Since the functions of the respective components of the apparatus for analyzing the influence of electromagnetic waves 100 for performing the respective steps have been described above with reference to FIGS. 1 to 3, duplicate description thereof will be omitted.

According to the embodiment of the present disclosure described above, it is possible to effectively find methods for protecting the drone 200 against an electromagnetic wave attack or the like by analyzing the abnormal state of the drone 200 generated by electromagnetic waves under various conditions and the cause thereof.

Further, according to the embodiment of the present disclosure, it is possible to effectively cope with an electromagnetic wave attack by analyzing in advance the resistance of a drone 200 to electromagnetic waves depending on the size, type, manufacturer, chip structure, etc. of the drone 200.

The above embodiments may be implemented by various devices. For example, the embodiments of the present disclosure may be implemented by hardware, firmware, software, or a combination thereof.

In the case of implementation using hardware, the method according to the embodiment of the present disclosure may be implemented by one or more devices, such as ASICs (Application Specific Integrated Circuits), DSPs (Digital Signal Processors), DSPDs (Digital Signal Processing Devices), PLDs (Programmable Logic Devices), FPGAs (Field Programmable Gate Arrays), processors, controllers, microcontrollers, microprocessors or the like.

In the case of implementation using firmware or software, the method according to the embodiment of the present disclosure may be implemented in the form of modules, procedures or functions for performing the above-described functions or operations. A computer program in which a software code or the like is recorded may be stored in a computer-readable storage medium or a memory unit and executed by a processor. The memory unit may be provided inside or outside the processor to exchange data with the processor by various known units.

Combinations of blocks in the flowcharts of the present disclosure can be implemented by computer program instructions. These computer program instructions may be provided to a processor of a general purpose computer, special purpose computer, or other programmable data processing apparatus, such that the instructions, which execute via the processor of the computer or other programmable data processing apparatus, create means for implementing the functions specified in the steps of the flowchart. These computer program instructions may also be stored in a computer usable or computer readable memory that can direct a computer or other programmable data processing apparatuses to function in a particular manner, such that the instructions stored in the computer usable or computer readable medium can produce an article of manufacture including instructions that implement the function specified in the blocks of the flowcharts. The computer program instructions may also be loaded onto a computer or other programmable data processing apparatuses to cause a series of operational steps to be performed on the computer or other programmable apparatuses to produce a computer implemented process such that the instructions that execute on the computer or other programmable apparatuses provide processes for implementing the functions specified in the blocks of the flowcharts.

Each block in the flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The above description is merely an exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. An apparatus for analyzing influence of electromagnetic waves, comprising:
   an electromagnetic wave radiation unit configured to radiate electromagnetic waves;
   a drone control unit configured to transmit to a target drone control information for controlling the target drone;
   an information receiving unit configured to receive status information indicating an operation state of the target drone as a response to the control information; and
   an electromagnetic wave influence analyzing unit configured to determine the influence of the electromagnetic waves on the target drone by comparing the control information and the status information.

2. The apparatus of claim 1, further comprising:
   a drone tracing unit configured to acquire position information of the target drone,
   wherein the electromagnetic wave radiation unit is configured to radiate the electromagnetic waves toward the target drone based on the position information.

3. The apparatus of claim 2, wherein the position information includes at least one of coordinates of a location of the target drone with respect to a position of the apparatus, a distance from the apparatus to the target drone, a moving direction of the target drone and an altitude of the target drone.

4. The apparatus of claim 2, wherein the drone tracing unit is configured to acquire the position information via a radar for detecting the target drone or an imaging device for capturing an image of the target drone.

5. The apparatus of claim 1, wherein the electromagnetic wave radiation unit is configured to change at least one of kind, intensity, frequency, pulse width and pulse repetition period of the electromagnetic waves.

6. The apparatus of claim 1, wherein the information receiving unit is configured to receive the status information from at least one of a sensor provided in the target drone, a radar for tracing the target drone and an imaging device for capturing an image of the target drone.

7. The apparatus of claim 6, wherein when the information receiving unit receives the status information from the sensor, the status information includes at least one of a control signal transmitted from a flight controller of the target drone to an electronic speed controller (ESC) of the target drone, a current signal transmitted from the ESC to a motor of the target drone and RPM information of the motor.

8. The apparatus of claim 6, wherein when the information receiving unit receives the status information from the radar or the imaging device, the status information includes at least one of a position of the target drone, a moving direction of the target drone, a posture of the target drone and a speed of the target drone.

9. The apparatus of claim 8, wherein the status information is acquired from at least one of a motor sensor, a GPS sensor, a gyro sensor, an acceleration sensor and a compass sensor provided in the target drone.

10. The apparatus of claim 1, wherein when the control information and the status information do not coincide with each other, the electromagnetic wave influence analyzing unit is configured to determine a cause of the inconsistency between the status information and the control information based on a difference between the control information and the status information.

11. The apparatus of claim 1, wherein the electromagnetic wave influence analyzing unit is configured to pre-store abnormality information indicating an abnormal operation status of each component in the target drone and to determine whether the status information coincides with the abnormality information.

12. The apparatus of claim 1, wherein the electromagnetic wave influence analyzing unit is configured to pre-store information on the target drone including at least one of model, size, type, manufacturer, flight controller information, electronic speed controller information and motor information, and to determine a degree of change of the status information according to the information on the target drone.

13. An method for analyzing an influence of electromagnetic waves, comprising:
   a step of radiating electromagnetic waves toward a target drone;
   a step of transmitting to the target drone control information for controlling the target drone;
   a step of receiving status information indicating an operation state of the target drone as a response to the control information; and
   a step of determining the influence of the electromagnetic waves on the target drone by comparing the control information and the status information.

14. The method of claim 13, further comprising:
   a step of acquiring position information of the target drone,
   wherein the step of radiating the electromagnetic waves includes radiating the electromagnetic waves toward the target drone based on the position information.

15. The method of claim 14, wherein the step of acquiring the position information includes acquiring the position information via a radar for detecting the target drone or an imaging device for capturing an image of the target drone.

16. The method of claim 13, wherein the step of receiving the status information includes receiving the status information from at least one of a sensor provided in the target drone, a radar for tracing the target drone and an imaging device for capturing an image of the target drone.

17. The method of claim 16, wherein when the status information is received from the sensor, the status information includes at least one of a control signal transmitted from a flight controller of the target drone to an electronic speed controller of the target drone, a current signal transmitted from an electronic speed controller (ESC) to a motor of the target drone and RPM information of the motor.

18. The method of claim 13, wherein when the control information and the status information do not coincide with each other, the step of determining the influence of the electromagnetic waves includes, determining a cause of the inconsistency between the status information and the control information based on a difference between the control information and the status information.

19. The method of claim 13, wherein the step of determining the influence of the electromagnetic waves includes pre-storing abnormality information indicating an abnormal operation status of each component in the target drone and determining whether the status information coincides with the abnormality information.

20. The method of claim 13, wherein the step of determining the influence of the electromagnetic waves includes pre-storing information on the target drone including at least one of model, size, type, manufacturer, flight controller information, electronic speed controller information and motor information, and determining a degree of change of the status information according to the information on the target drone.

* * * * *